(12) United States Patent
Cheng et al.

(10) Patent No.: US 8,785,273 B2
(45) Date of Patent: Jul. 22, 2014

(54) FINFET NON-VOLATILE MEMORY AND METHOD OF FABRICATION

(75) Inventors: Kangguo Cheng, Schenectady, NY (US); Bruce B. Doris, Slingerlands, NY (US); Ali Khakifirooz, Mountain View, CA (US); Pranita Kulkarni, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 139 days.

(21) Appl. No.: 13/444,219

(22) Filed: Apr. 11, 2012

(65) Prior Publication Data

US 2013/0270627 A1    Oct. 17, 2013

(51) Int. Cl.
  *H01L 21/8242*   (2006.01)
  *H01L 21/8234*   (2006.01)

(52) U.S. Cl.
  CPC .............................. *H01L 21/823431* (2013.01)
  USPC ............................ 438/241; 438/149; 257/315

(58) Field of Classification Search
  USPC ......................................................... 438/241
  See application file for complete search history.

(56) References Cited

U.S. PATENT DOCUMENTS

| | | | |
|---|---|---|---|
| 6,611,029 B1 | 8/2003 | Ahmed et al. | |
| 6,903,967 B2 | 6/2005 | Mathew et al. | |
| 7,288,823 B2 | 10/2007 | Youn et al. | |
| 2005/0272192 A1* | 12/2005 | Oh et al. | 438/197 |
| 2006/0091450 A1 | 5/2006 | Zhu et al. | |
| 2006/0097310 A1* | 5/2006 | Kim et al. | 257/321 |
| 2007/0181930 A1 | 8/2007 | Zhu et al. | |
| 2008/0203462 A1 | 8/2008 | Goarin | |
| 2008/0259687 A1 | 10/2008 | Specht et al. | |
| 2010/0314684 A1 | 12/2010 | Sonsky et al. | |
| 2011/0101455 A1* | 5/2011 | Basker et al. | 257/347 |

FOREIGN PATENT DOCUMENTS

EP    1 912 254 A2    4/2008

OTHER PUBLICATIONS

Joshi, et al, "FinFET SRAM Design," VLSI Design, 2010. VLSID '10. 23rd International Conference on pp. 440-445, Jan. 3-7, 2010.

* cited by examiner

*Primary Examiner* — Ajay K Arora
(74) *Attorney, Agent, or Firm* — Vazken Alexanian

(57) ABSTRACT

A method of manufacturing a FinFET non-volatile memory device and a FinFET non-volatile memory device structure. A substrate is provided and a layer of semiconductor material is deposited over the substrate. A hard mask is deposited over the semiconductor material and the structure is patterned to form fins. A charge storage layer is deposited over the structure, including the fins and the portions of it are damaged using an angled ion implantation process. The damaged portions are removed and gate structures are formed on either side of the fin, with only one side having a charge storage layer.

17 Claims, 7 Drawing Sheets

Cross-section through S/D

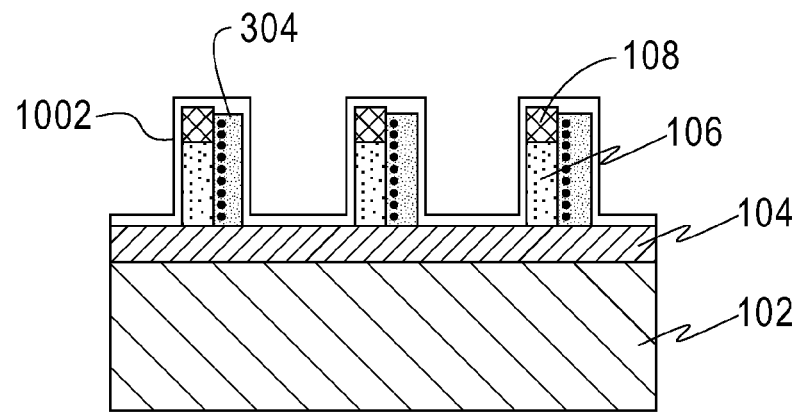
FIG. 10
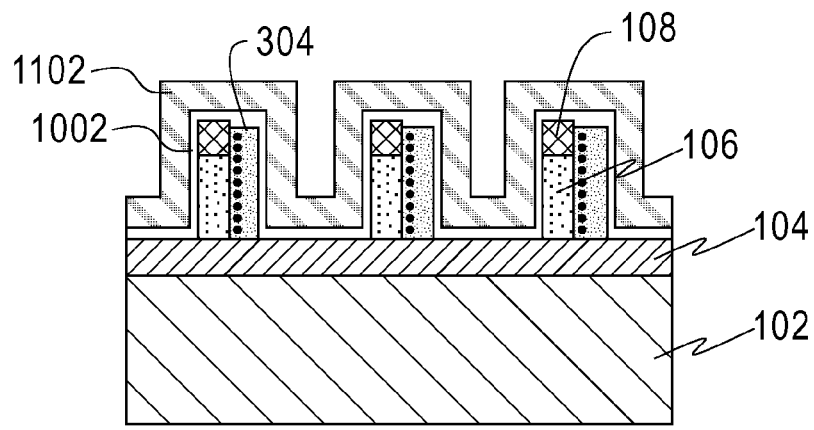
FIG. 11
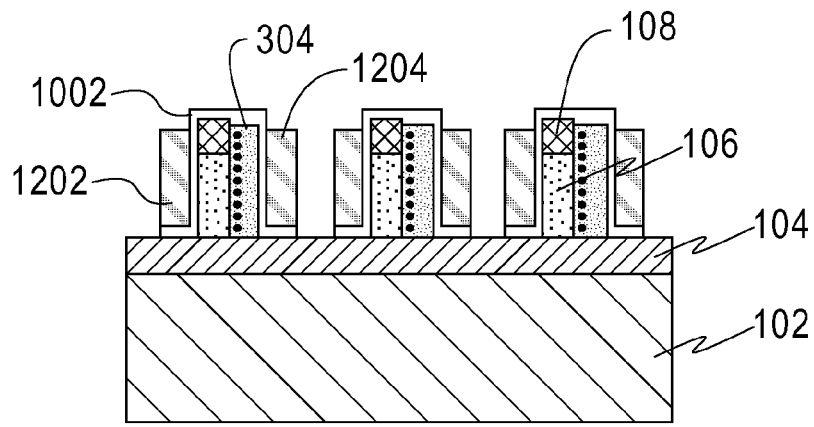
FIG. 12A (SOI Fin)
Cross-section through gate

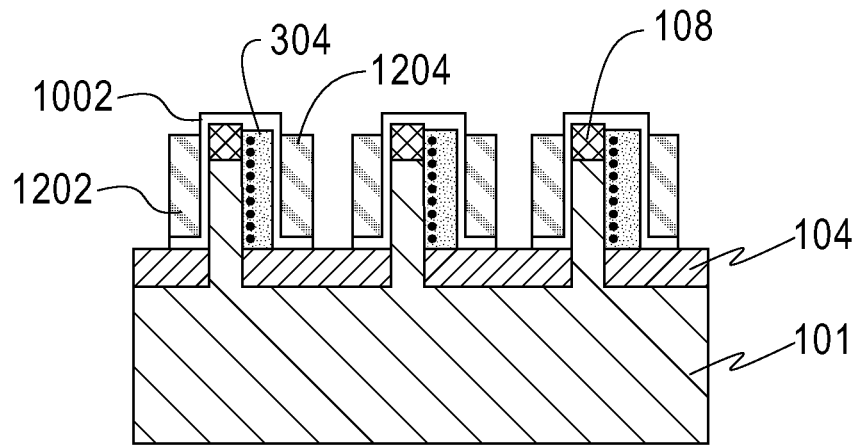
FIG. 12B (bulk FinFET)
Cross-section through gate
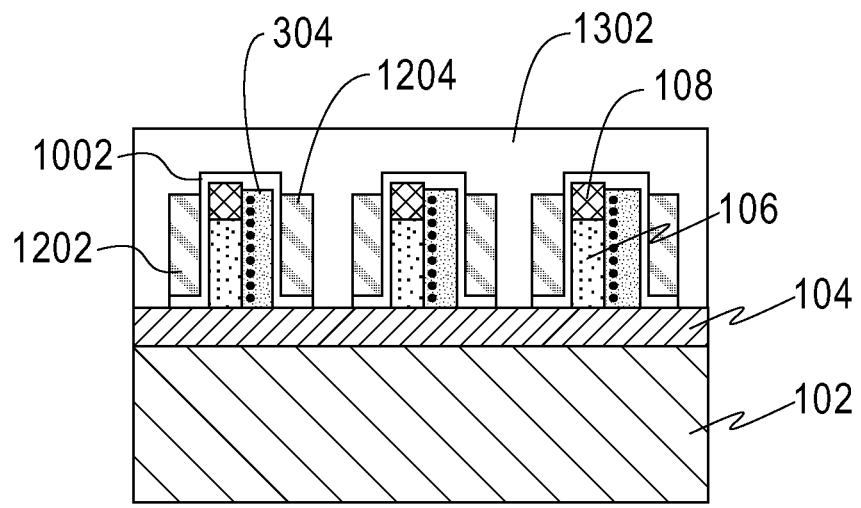
FIG. 13

Cross-section through S/D

Cross-section through S/D

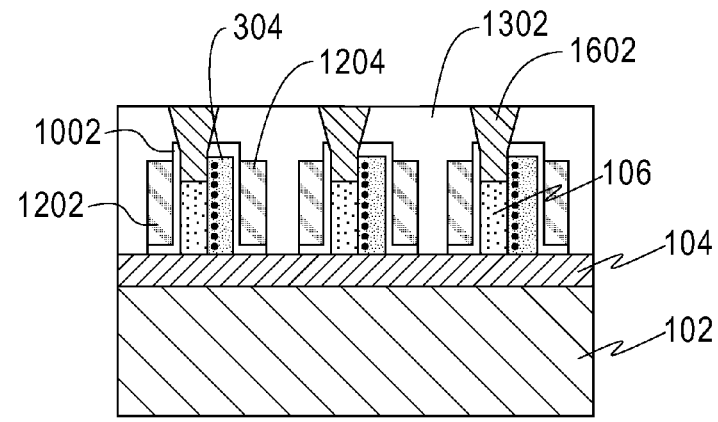
FIG. 16
Cross-section through S/D
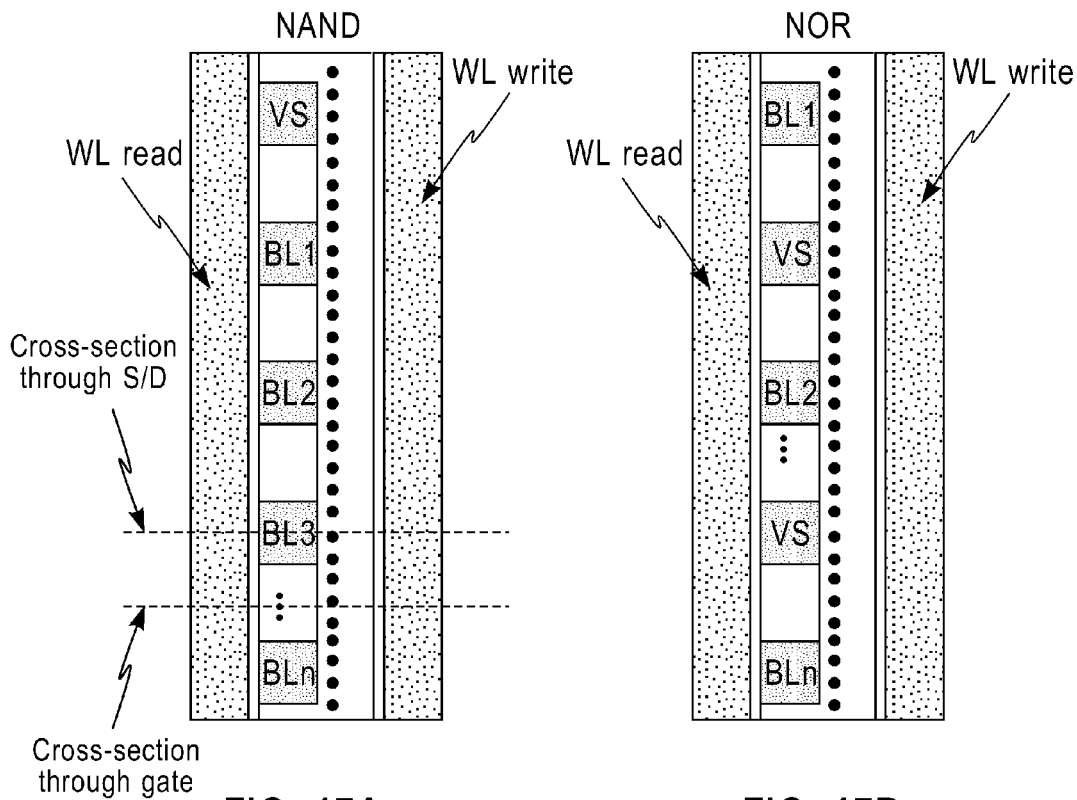
FIG. 17A  FIG. 17B

US 8,785,273 B2

FINFET NON-VOLATILE MEMORY AND METHOD OF FABRICATION

BACKGROUND OF THE INVENTION

1. Field of the Invention

The present invention generally relates to a non-volatile memory device, and more specifically to a FinFET non-volatile memory device.

2. Description of Related Art

Embedded non-volatile memory cells can add significant functionality to integrated circuits. Flash cells based on FinFET, trigate, or nanowire transistors are especially of interest because of excellent short channel control offered by these device structures which provide better device scalability compared to bulk devices. Different cells based on these devices have been proposed in recent years with an ONO, high-k, or nano-crystal charge storage element that surrounds the entire channel. The main drawback of such a structure is its low drive current due to the thick gate oxide. In planar SOI devices, it is possible to decouple the write and read operation by placing the storage element inside the BOX. The front gate oxide can then be scaled as aggressively as the logic transistors, providing significantly higher read current and better read and write speed.

BRIEF SUMMARY OF THE INVENTION

To overcome these deficiencies, the present invention provides a method of manufacturing a FinFET non-volatile memory device, including: providing a substrate; depositing a layer of a semiconductor material over the substrate; depositing a first dielectric layer on top of the semiconductor layer; patterning the semiconductor layer and the first dielectric layer to form a fin structure; depositing a charge storage layer on a first sidewall surface, a second sidewall surface and a top surface of the fin structure, the first sidewall being parallel to and opposing the second sidewall; damaging the charge storage layer on the first sidewall and top surface by an angled ion implantation process; etching the damaged charged storage layer until it is substantially removed; and forming a first gate structure adjacent to the first sidewall and a second gate structure adjacent to the undamaged charge storage layer.

According to another aspect, the present invention provides a method of manufacturing a FinFET non-volatile memory device, including: providing a substrate; depositing a layer of a semiconductor material over the substrate; depositing a first dielectric layer on top of the semiconductor layer; patterning the semiconductor layer and the first dielectric layer to form a fin structure; depositing a charge storage layer on a first sidewall surface, a second sidewall surface and a top surface of the fin structure, the first sidewall being parallel to and opposing the second sidewall; depositing a second dielectric layer over the charge storage layer; damaging the second dielectric layer on the first sidewall and top surface by an angled ion implantation process; etching the damaged second dielectric layer until it is substantially removed, exposing portions of the charge storage layer; etching the exposed portions of the charge storage layer until they are substantially removed; etching the remaining second dielectric layer until it is substantially removed; and, forming a first gate structure adjacent to the first sidewall and a second gate structure adjacent to the undamaged charge storage layer.

According to yet another aspect, the present invention provides a FinFET non-volatile memory device, including: at least two field effect transistors, each including: a substrate; a semiconductor fin structure over the substrate, including a first and a second sidewall, the first sidewall being parallel to and opposing the second sidewall; a first terminal contact and a second terminal contact; a channel region between the at least first and second terminal contacts, wherein the channel region is parallel to and in-between the first and second sidewalls; a storage stack adjacent to the second sidewall; a gate dielectric covering at least the first sidewall and the storage stack; a first gate electrode adjacent to the first sidewall, wherein the gate dielectric is in between the first sidewall and the first gate electrode; and a second gate electrode adjacent to the storage stack, wherein the gate dielectric is in between the storage stack and the second gate electrode.

BRIEF DESCRIPTION OF THE SEVERAL VIEWS OF THE DRAWINGS

FIG. 10 is cross sectional view of a fabrication step of a FinFET non-volatile memory device after the deposition of a gate dielectric.

FIG. 11 is cross sectional view of a fabrication step of a FinFET non-volatile memory device after the formation of a gate electrode.

FIG. 12a is cross sectional view through the gate of a fabrication step of a FinFET non-volatile memory device after the formation of split gates.

FIG. 12b is cross sectional view through the gate of a fabrication step of a FinFET non-volatile memory device after the formation of split gates formed on a bulk substrate.

FIG. 13 is cross sectional view of a fabrication step of a FinFET non-volatile memory device with a dielectric deposited on top.

FIG. 16 is cross sectional view of a fabrication step of a FinFET non-volatile memory device with the source and drain regions formed through the contact holes and then filled with metal.

FIG. 17a is an overhead view of a NAND memory cell configuration using the FinFET non-volatile memory device.

FIG. 17b is an overhead view of a NOR memory cell configuration using the FinFET non-volatile memory device.

DETAILED DESCRIPTION OF THE PREFERRED EMBODIMENTS

Figure 1:
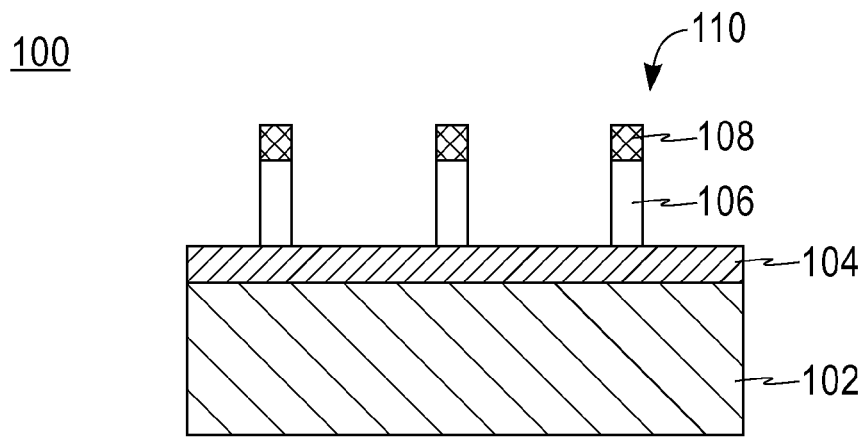
FIG. 1 is cross sectional view of a fabrication step of a FinFET non-volatile memory device after the formation of a fin structure.

With reference now to FIG. 1, a cross-sectional view of one embodiment of a FinFET non-volatile memory device in an early stage of production is shown. Device 100 includes a semiconductor layer 102 and an insulating layer 104 formed over the semiconductor layer 102. Fin structure 110 is formed over insulating layer 104. In another embodiment, fin structure 110 can be formed over a strained silicon-on-insulator (sSOI) substrate. In other embodiments, the fin structure 110 can be formed over a bulk semiconductor substrate, including silicon, germanium, and the like. The embodiments described herein are not restricted to any specific semiconductor substrate configuration unless explicitly stated in an embodiment or the claims. Fin structure 110 includes a semiconductor portion 106 and a hard mask portion 108. In an embodiment, the semiconductor portion is silicon. In an embodiment, the hard mask 108 is a dielectric material, such as silicon dioxide, silicon nitride, silicon oxynitride, and the like.

In an embodiment, fin structure 110 is formed by depositing a layer of a semiconductor material, e.g. silicon, over insulating layer 104 and depositing a dielectric layer on top of the semiconductor material layer. This dielectric layer forms a hard mask. In a next processing step, the semiconductor layer and dielectric layer are patterned to form fin structure 110. In an embodiment, this is done by an photolithographic process or side-wall image transfer (SIT) process, as is known in the art. In an embodiment, after patterning, the fin structure can have a height in a range of 15-50 nm and a width in a range of 5-20 nm. In addition, the length of the fin channel can vary, and various embodiments can range from 15-50 nm. As will be discussed later, the channel length is measured between the source and drain, to be formed later in semiconductor portion 106 and located at points along the fin structure 110, into and out of the page of FIG. 1. The length of the fin can vary in the range of 100-2000 nm, so that multiple FinFET non-volatile memory cells can be fabricated on a single fin.

Figure 2:
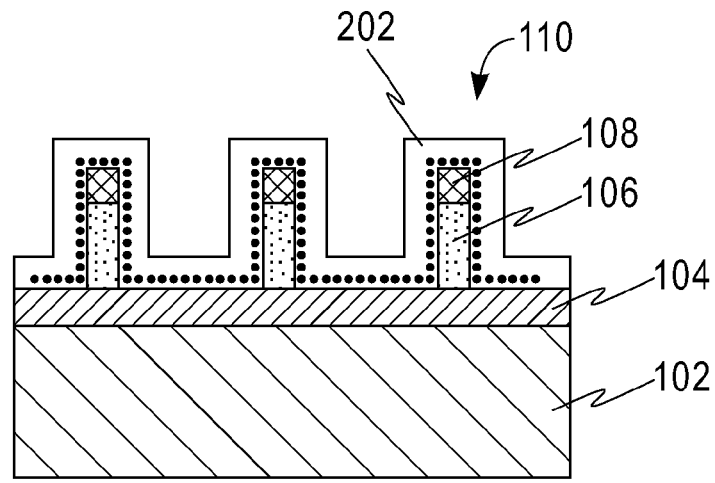
FIG. 2 is cross sectional view of a fabrication step of a FinFET non-volatile memory device after the deposition of a storage element.

Referring now to FIG. 2, a charge storage layer 202 is deposited on the top and side of the fin structure 110 as well as the top of the insulating layer 104. This forms a fin structure with a charge storage element on all sides, as is known in the art. The charge storage layer 202 can be any non-volatile memory storage technology as is known in the art. For example, the charge storage layer 202 can be, but is not limited to, any of the following storage stacks: dielectric/poly-silicon/dielectric, silicon dioxide/silicon nitride/silicon dioxide, silicon dioxide/high-k dielectric/silicon dioxide, dielectric that contains nanoparticles, and the like. In an embodiment, charge storage layer 202 represents multiple layers. Hereafter, the charge storage layer 202 will also be referred to as a charge storage stack.

Figure 3:
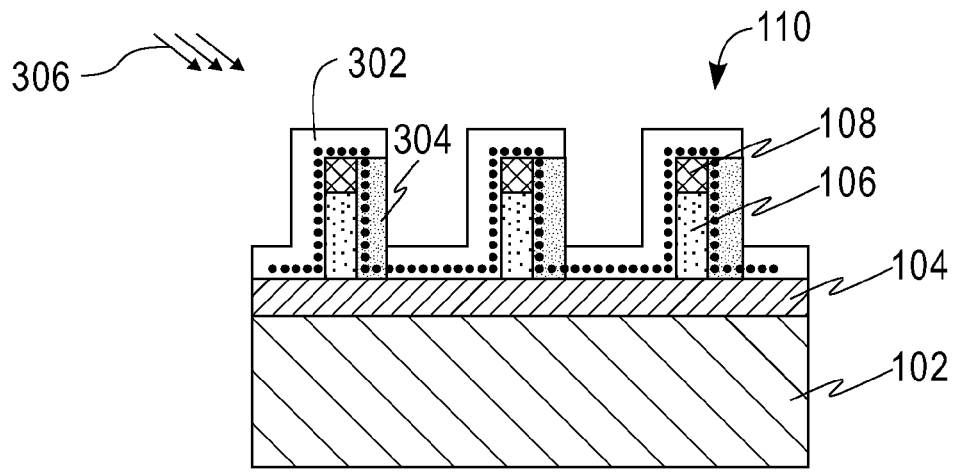
FIG. 3 is cross sectional view of a fabrication step of a FinFET non-volatile memory device with a portion of the storage element damaged by an angled ion implantation process.

Referring now to FIG. 3, angled ion implantation process 306 is performed to damage part of the charge storage layer 202. In the embodiment shown in FIG. 3, the ion implantation is performed at an angle such that the left side of the fin structure 110 and the top side of the fin structure 110 are both damaged but the right side below the top right corner is undamaged. This process leaves behind a damaged charge storage stack 302 and an undamaged charge storage stack 304. In practice, the angle of the ion implantation process will range from about 30 to 60 degrees from the horizontal insulating layer 104, depending on the distance between fin structures. In some embodiments, xenon, argon, krypton, and the like can be used for the ion implantation. In some embodiments, they are implanted at a dose ranging from $1*10^{14}$ ions/cm$^2$ to $1*10^{16}$ ions/cm$^2$.

Figure 4:
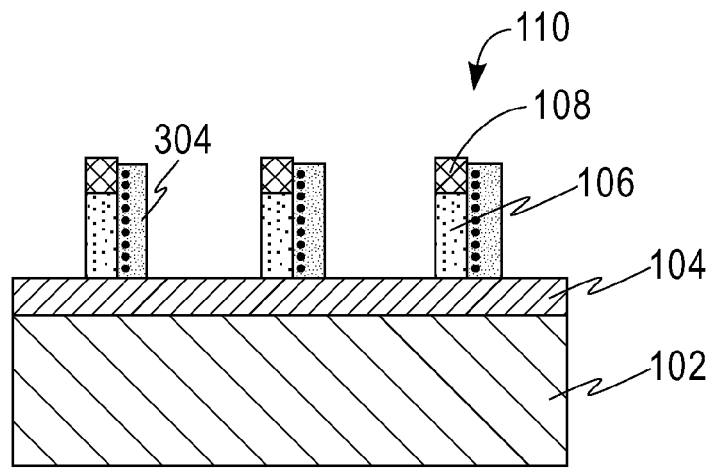
FIG. 4 is cross sectional view of a fabrication step of a FinFET non-volatile memory device after the removal of the damaged storage element portion.

Referring now to FIG. 4, the damaged charge storage stack 302 is removed, leaving the undamaged charge storage stack 304 intact. In an embodiment, a wet etch is used to remove the damaged charge storage stack 302, for example a wet HF etch. At this point in the manufacturing process, the device 100 now has a fin with a storage stack only on one side, and with later steps will be manufactured into a FinFET non-volatile memory device with a storage stack only on one side.

Figure 5:
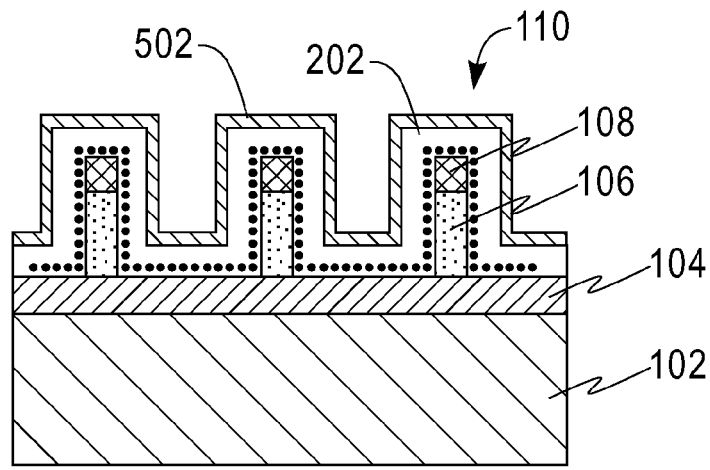
FIG. 5 is cross sectional view of a fabrication step of a FinFET non-volatile memory device with a hard mask deposited on top of the storage element.

According to another embodiment, the device as shown in FIG. 4 can be manufactured to this stage by different steps. Referring now to FIG. 5, the device is shown again with the charge storage layer fully intact. In this embodiment, instead of damaging the charge storage layer 202 with ion implantation, a hard mask 502 is deposited over the entire device. If the ion implantation process performed in FIG. 3 would not have effectively damaged the charge storage layer 202, then this additional step is taken and a different method of removing a section of the charge storage layer 202 is used.

In an embodiment where, for example, a high-k oxide stack is used as the charge storage layer 202, a hard mask 502 can be used. In this case, damaging the high-k oxide stack directly with an angled ion implantation process may be ineffective. In an embodiment, a nitride is used as the hard mask 502, for example silicon nitride.

Figure 6:
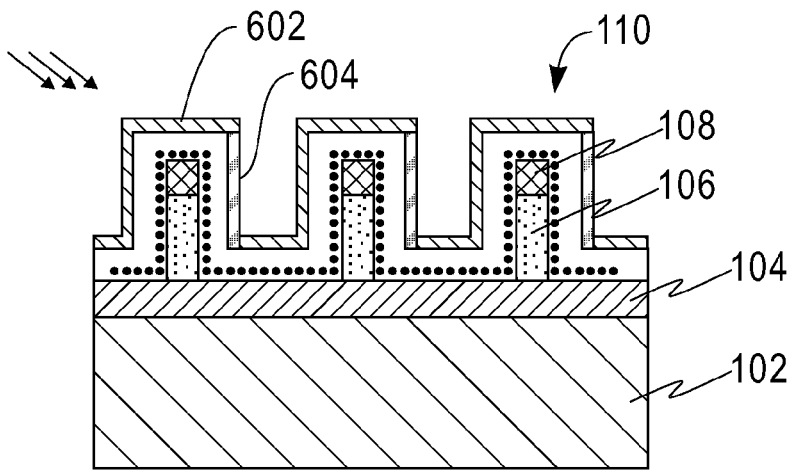
FIG. 6 is cross sectional view of a fabrication step of a FinFET non-volatile memory device with a portion of the hard mask damaged by an angled ion implantation process.

Referring now to FIG. 6, angled ion implantation is performed to damage part of hard mask 502. In the embodiment shown in FIG. 6, the ion implantation is performed at an angle such that the hard mask portion 602 covering the left side of the fin structure 110 and the top side of the fin structure 110 are both damaged but the hard mask portion 604 covering the right side below the top right corner is undamaged. In practice, the angle of the ion implantation process will range from about 30 to 60 degrees from the horizontal insulating layer 104. In an embodiment with a nitride hard mask, xenon can be used for the ion implantation, at a dose ranging from $1*10^{14}$ ions/cm$^2$ to $1*10^{16}$ ions/cm$^2$.

Figure 7:
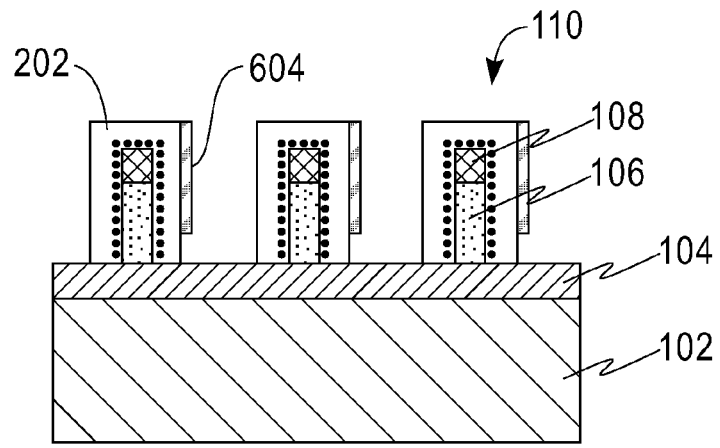
FIG. 7 is cross sectional view of a fabrication step of a FinFET non-volatile memory device after the removal of the damaged hard mask portion, exposing a section of the storage element.

Referring now to FIG. 7, the damaged hard mask portion 602 is removed and the undamaged hard mask portion 604 remains. In an embodiment, a wet etch is used to remove the damaged gate stack, for example a wet HF etch, while leaving the undamaged portion 604 intact.

Figure 8:
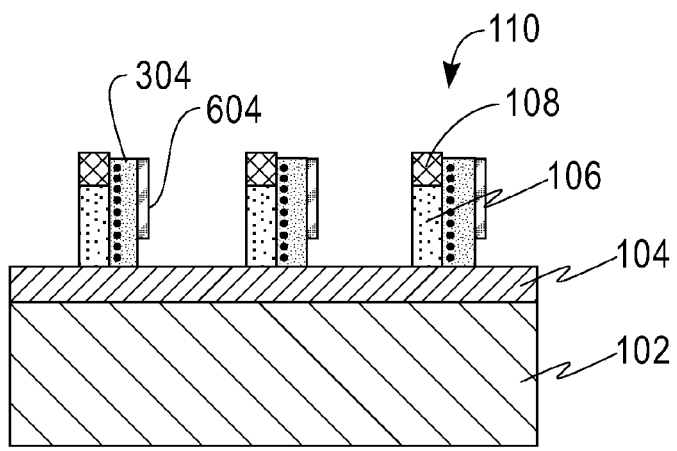
FIG. 8 is cross sectional view of a fabrication step of a FinFET non-volatile memory device after the exposed storage element is removed.

Referring now to FIG. 8, the now exposed portion of the charge storage layer 202 is removed. In an embodiment a timed etch is performed so as to ensure that the entire exposed portion of the charge storage layer 202 is removed. It will also remove part of the unexposed storage stack as can be seen in FIG. 8, where the remaining top portion of the charge storage layer 304 is recessed slightly below the top of the hard mask 108.

Figure 9:
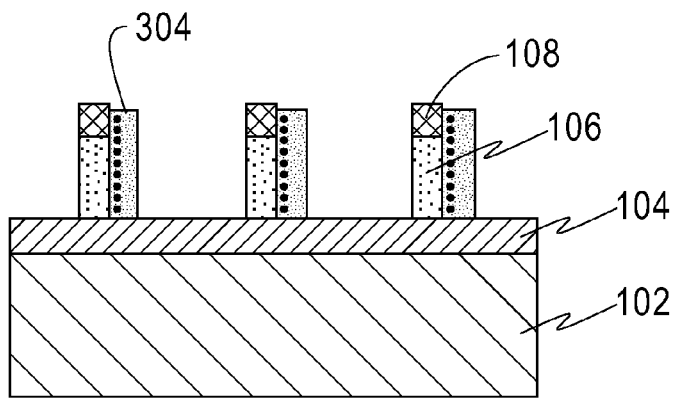
FIG. 9 is cross sectional view of a fabrication step of a FinFET non-volatile memory device after the removal of the hard mask.

Referring now to FIG. 9, the remaining portion 604 of the hard mask 502 is removed. In an embodiment, hot phosphoric acid is used to etch the remaining portion 604 of the hard mask 502 while leaving the other components of the device 100 intact. In another embodiment, a diluted HF etch is performed to remove the portion 604 while leaving the other components of the device 100 intact. Alternatively, the remaining portion 604 of the hard mask can be left intact and removed later or remain as part of the device.

In the next processing steps, i.e. after FIG. 4 or after FIG. 9, depending on the embodiment, a gate structure is formed on both sides of the device. In an embodiment, this process is started with depositing a gate dielectric 1002 uniformly over the device 100, as shown in FIG. 10. In an embodiment, silicon dioxide is used as the gate dielectric. In other embodiments, a high-k dielectric can be used as the gate dielectric 1002, such as hafnium oxide, hafnium silicate, hafnium silicon oxynitride, zirconium silicate, zirconium oxide, and the like. In an embodiment, the gate dielectric is deposited using chemical vapor deposition (CVD) as is known in the art. In other embodiments, the gate dielectric can be deposited by atomic layer deposition (ALD) or other deposition techniques, as are known in the art. In an embodiment, the gate dielectric 1002 is deposited to an overall thickness in the range of 1-3 nm.

After the deposition of the gate dielectric 1002, a gate electrode is formed next. Referring to FIG. 11, a gate material is deposited over the device 100. In an embodiment, the gate material is polysilicon. In other embodiments, a metal gate material is used. In an embodiment, the gate material is deposited to a thickness in the range of 20-100 nm. At the conclusion of this step, a gate electrode 1102 is formed and surrounds the fin structure 110. In the next processing steps, the gate electrode is split. In an alternative embodiment, the gate electrode can be left intact. In this embodiment, the device programming would be designed such that the same voltage is applied to both the "top" and "bottom" gates during read and write operation, and eliminate the need to split the gates, simplifying device wiring. Here, the terms "top" and "bottom" gate refer to the gate located adjacent to the side of the device without a charge storage layer and to the gate located adjacent to the side of the device with a charge storage layer, respectively.

Referring now to FIG. 12a, this embodiment continues with the fabrication of split gates. This figure illustrates a cross section of the device where the cross section is taken through the channel region, between the later added source and drain regions. Referring to FIG. 17a, an overhead view of the device, this cross section refers to the section "cross-section through the gate." The boxes titled "VS, BL1, BL2 . . ." refer to the areas where the source and drain are later added. In a first processing step, a chemical mechanical polishing (CMP) is performed on the device. At the conclusion of the CMP, there may be some gate material left on top of the fin structure 110, and therefore an electrical connection. In order to remove any possible remaining connection, this embodiment continues with a short timed etch. The type of etch used depends on the material used for the gate. For example, a wet HNA (HF, nitric acid, acetic acid) etch can be used to etch a polysilicon gate. The etch process will last only as long as necessary for any remaining connection to be removed. Referring again to FIG. 12, this process leaves two split gates behind, a "top" gate 1202 and a "bottom" gate 1204, and these form the two gate structures on both sides of the device. As can be seen in FIG. 12, the top and bottom gates are slightly recessed with respect to the top of the gate dielectric 1002 as a result of this timed etch step.

FIG. 12b illustrates an alternative embodiment of the device at the same stage of manufacturing as FIG. 12a. In this embodiment, a bulk substrate is used instead of an SOI substrate. As can be seen in FIG. 12b, the bulk substrate 101 extends into fin structure 110, with no separate semiconductor portion 106 as noted in the previous figures. All other aspects of this embodiment remain the same.

In a next processing step, a dielectric is deposited over the entire wafer. In an embodiment, the dielectric can be silicon dioxide. Referring now to FIG. 13, the device is shown filled with the dielectric material 1302. Dielectric 1302 can be deposited by any known technique, including but not limited to ALD.

Figure 14:
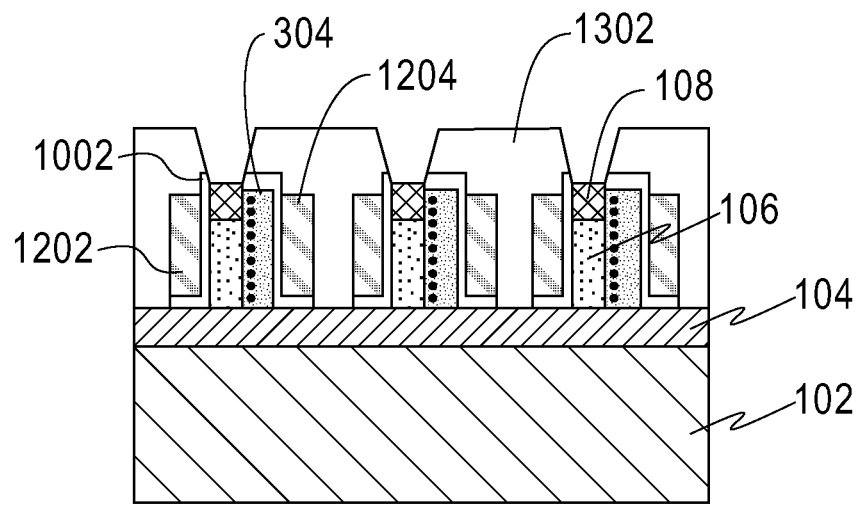
FIG. 14 is cross sectional view of a fabrication step of a FinFET non-volatile memory device with contact holes opened in the dielectric.
Figure 15:
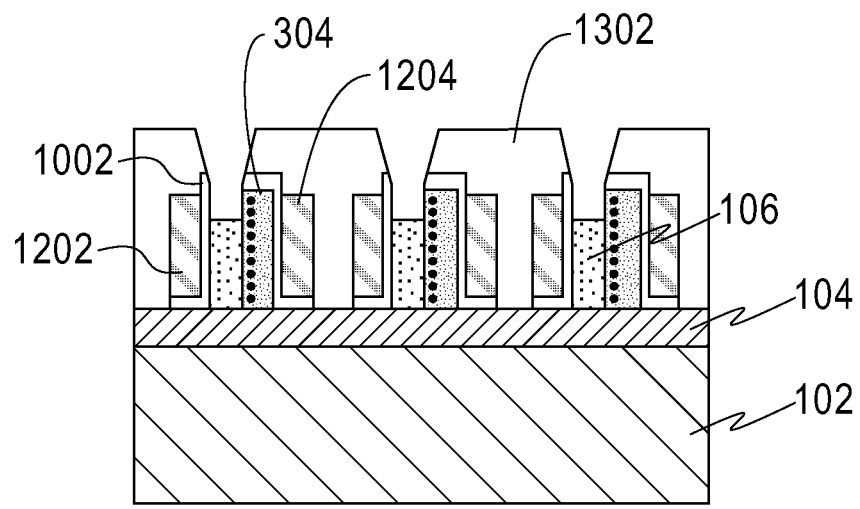
FIG. 15 is cross sectional view of a fabrication step of a FinFET non-volatile memory device with the hard mask removed through the contact holes.

FIGS. 14-16 are cross sections that are specifically through a source/drain region. Referring to FIG. 17a, the section marked "cross-section through S/D" is the cross section shown in these figures.

Referring now to FIG. 14, contact holes are opened along the fin structure. In an embodiment, a standard lithography and etch process as is known in the art is used to open holes at locations along the fin structure, defining the channel length.

Referring now to FIG. 15, portions of the hard mask 108 that have been exposed by the lithography process are removed. In an embodiment, the newly exposed hard mask is removed by an etching process, exposing the underlying semiconductor portion 106 wherever a contact hole is opened.

Referring now to FIG. 16, source and drain regions are formed in the semiconductor portion 106 by, for example, a standard implantation and annealing process. In an embodiment, this ion implantation process can dope a region with a P-type dopant or an N-type dopant, depending on the desired semiconductor device. An anneal cycle can be used to activate the dopants from the ion implementation process.

In a next processing step, a silicide is deposited over the newly formed source and drain regions, and then the contact is filled with a metal. A CMP process is used to smooth the top surface of the device and finalize the formation of the terminal contacts 1602.

FIGS. 17a and 17b are diagrams of a non-volatile memory array implementation of the transistor device in both a NAND setup and a NOR setup, respectively.

FIG. 17a is the device set up in a NAND configuration. In FIG. 17a, VS and BL1 are the source and drain of a first transistor. These points correspond to the connection points to the terminal contacts 1602 of the device, as described in previous steps. BL1 and BL2 are the source and drain of a second transistor, BL2 and BL3 are a source and drain of a third transistor, and so on. These points are connected to the bit lines of the memory array. In this embodiment, the gate 1202 is couple to word line WL Read and the gate 1204 is coupled to word line WL Write.

FIG. 17b is the device set up in a NOR configuration. In this configuration, BL1 and VS are the drain and source of a first transistor, BL2 and VS are the drain and source of a second transistor (where VS is the same for each of these two transistors). This continues until BLn is reached, where n is the last terminal contact. In the same manner as in FIG. 17A, the gate 1202 is coupled to the word line WL Read and the gate 1204 is coupled to the word line WL Write.

In both of these setups, a separate word line is provided for the read and write operations, resulting in a device where the word lines runs parallel to the fin structure.

The programming of the device is done in a similar manner to that of an NAND device and an NOR device, as is known in the art, with the difference being that there are separate gates for read and write operations. As a result, their respective operations are decoupled. When a voltage would be applied to the word line for programming in a typical device (usually high voltages), it is applied here only to WL Write, and when a voltage would be applied to the word line for reading in a typical device (usually low voltages), it is applied here only to WL Read.

The following is an example of operation of the device as NAND and NOR memories:

NAND
Program:
Selected WL Write=10/−10V (write/erase)
Selected WL Read=0V (write/erase)
Unselected WL Write=0V
Unselected WL Read=1V
Read:
Selected WL Read=1V
Unselected WL Read=0V
NOR
Write:
Selected WL Write=10V
Selected WL Read=1V
Unselected WL Write=0V
Unselected WL Read=0V
Read:
Selected WL Read=1V
Unselected WL Read=0V The voltages across the bit lines (i.e. BL1 to BL2) can vary and are not specific to present disclosure. The separation of the word lines for read and write are specific to this invention. The preceding was an example of one programming method of the device, and does not exclude other methods of programming.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of manufacturing a FinFET non-volatile memory device, comprising:
   providing a substrate;
   depositing a layer of a semiconductor material over said substrate;
   depositing a first dielectric layer on top of said semiconductor layer;
   patterning said semiconductor layer and said first dielectric layer to form a fin structure;
   depositing a charge storage layer on a first sidewall surface, a second sidewall surface and a top surface of said fin structure, said first sidewall being parallel to and opposing said second sidewall;
   damaging said charge storage layer on said first sidewall and top surface by an angled ion implantation process;
   etching said damaged charged storage layer until it is substantially removed;
   forming a first gate structure adjacent to said first sidewall and a second gate structure adjacent to said undamaged charge storage layer;
   depositing a second dielectric material over said device, wherein said fin and gate structures are completely covered;
   opening contact holes in said second dielectric material directly over said fin structure, exposing said first dielectric layer;
   etching said first dielectric layer until it is substantially removed;
   implanting dopants through said contact holes to form source and drain regions; and
   filling said contact holes with a metal.

2. The method according to claim 1, further comprising polishing the surface of said device by chemical mechanical polishing.

3. The method according to claim 1 wherein said substrate comprises an insulating layer overlying a semiconductor layer.

4. The method according to claim 1,
   wherein said first and second gate structures each comprise a gate dielectric and a gate electrode;
   wherein for said first gate structure, said gate dielectric is adjacent to said first sidewall and said first gate electrode is adjacent to said gate dielectric; and
   wherein for said second gate structure, said gate dielectric is adjacent to said charge storage layer and said second gate electrode is adjacent to said gate dielectric.

5. The method according to claim 1 wherein said substrate comprises an insulating layer overlying a semiconductor layer.

6. A method of manufacturing a FinFET non-volatile memory device, comprising:
   providing a substrate;
   depositing a layer of a semiconductor material over said substrate;
   depositing a first dielectric layer on top of said semiconductor layer;
   patterning said semiconductor layer and said first dielectric layer to form a fin structure;
   depositing a charge storage layer on a first sidewall surface, a second sidewall surface and a top surface of said fin structure, said first sidewall being parallel to and opposing said second sidewall;
   damaging said charge storage layer on said first sidewall and top surface by an angled ion implantation process;
   etching said damaged charged storage layer until it is substantially removed; and
   forming a first gate structure adjacent to said first sidewall and a second gate structure adjacent to said undamaged charge storage layer,
   wherein said first and second gate structures each comprise a gate dielectric and a gate electrode;
   wherein for said first gate structure, said gate dielectric is adjacent to said first sidewall and said first gate electrode is adjacent to said gate dielectric; and
   wherein for said second gate structure, said gate dielectric is adjacent to said charge storage layer and said second gate electrode is adjacent to said gate dielectric.

7. The method according to claim 6, further comprising polishing the surface of said device by chemical mechanical polishing.

8. The method according to claim 6 wherein said substrate comprises an insulating layer overlying a semiconductor layer.

9. A method of manufacturing a FinFET non-volatile memory device, comprising:
 providing a substrate;
 depositing a layer of a semiconductor material over said substrate;
 depositing a first dielectric layer on top of said semiconductor layer;
 patterning said semiconductor layer and said first dielectric layer to form a fin structure;
 depositing a charge storage layer on a first sidewall surface, a second sidewall surface and a top surface of said fin structure, said first sidewall being parallel to and opposing said second sidewall;
 damaging said charge storage layer on said first sidewall and top surface by an angled ion implantation process;
 etching said damaged charged storage layer until it is substantially removed; and
 forming a first gate structure adjacent to said first sidewall and a second gate structure adjacent to said undamaged charge storage layer,
 wherein said charge storage layer comprises a charge storage stack selected from the group consisting of: dielectric/poly-silicon/dielectric, silicon dioxide/silicon nitride/silicon dioxide, silicon dioxide/high-k dielectric/silicon dioxide, and a dielectric that contains nanoparticles.

10. The method according to claim 9, further comprising polishing the surface of said device by chemical mechanical polishing.

11. The method according to claim 9 wherein said substrate comprises an insulating layer overlying a semiconductor layer.

12. A method of manufacturing a FinFET non-volatile memory device, comprising:
 providing a substrate;
 depositing a layer of a semiconductor material over said substrate;
 depositing a first dielectric layer on top of said semiconductor layer;
 patterning said semiconductor layer and said first dielectric layer to form a fin structure;
 depositing a charge storage layer on a first sidewall surface, a second sidewall surface and a top surface of said fin structure, said first sidewall being parallel to and opposing said second sidewall;
 depositing a second dielectric layer over said charge storage layer;
 damaging said second dielectric layer on said first sidewall and top surface by an angled ion implantation process;
 etching said damaged second dielectric layer until it is substantially removed, exposing portions of said charge storage layer;
 etching said exposed portions of said charge storage layer until they are substantially removed;
 etching said remaining second dielectric layer until it is substantially removed; and,
 forming a first gate structure adjacent to said first sidewall and a second gate structure adjacent to said undamaged charge storage layer.

13. The method according to claim 12, further comprising:
 depositing a third dielectric material over said device, wherein said fin and gate structures are completely covered;
 opening contact holes in said third dielectric material directly over said fin structure, exposing said first dielectric layer;
 etching said first dielectric layer until it is substantially removed;
 implanting dopants through said contact holes to form source and drain regions; and
 filling said contact holes with a metal.

14. The method according to claim 13, further comprising polishing said contact holes by chemical mechanical polishing.

15. The method according to claim 12,
 wherein said first and second gate structures each comprise a gate dielectric and a gate electrode;
 wherein for said first gate structure, said gate dielectric is adjacent to said first sidewall and said first gate electrode is adjacent to said gate dielectric; and
 wherein for said second gate structure, said gate dielectric is adjacent to said charge storage layer and said second gate electrode is adjacent to said gate dielectric.

16. The method according to claim 12, wherein said charge storage layer comprises a charge storage stack selected from the group consisting of: dielectric/poly-silicon/dielectric, silicon dioxide/silicon nitride/silicon dioxide, silicon dioxide/high-k dielectric/silicon dioxide, and a dielectric that contains nanoparticles.

17. The method according to claim 12 wherein said substrate comprises an insulating layer overlying a semiconductor layer.

* * * * *